(12) United States Patent
Koide

(10) Patent No.: US 7,301,598 B2
(45) Date of Patent: Nov. 27, 2007

(54) ELECTRO-OPTICAL DEVICE AND ELECTRONIC APPARATUS

(75) Inventor: Shin Koide, Chino (JP)

(73) Assignee: Seiko Epson Corporation, Tokyo (JP)

( * ) Notice: Subject to any disclaimer, the term of this patent is extended or adjusted under 35 U.S.C. 154(b) by 363 days.

(21) Appl. No.: 11/015,414

(22) Filed: Dec. 20, 2004

(65) Prior Publication Data

US 2005/0194657 A1  Sep. 8, 2005

(30) Foreign Application Priority Data

Dec. 22, 2003  (JP)  ............. 2003-424708

(51) Int. Cl.
*G02F 1/1345* (2006.01)

(52) U.S. Cl. .............. 349/149; 349/150; 349/151; 349/152

(58) Field of Classification Search ........... 349/149, 349/150, 151–152
See application file for complete search history.

(56) References Cited

U.S. PATENT DOCUMENTS 5,677,712 A * 10/1997 Murahashi ............ 345/205
6,618,111 B1 * 9/2003 Nagata et al. ........... 349/149
6,756,975 B1 * 6/2004 Kishida et al. .......... 345/204
2004/0160404 A1   8/2004 Nakajima et al.

FOREIGN PATENT DOCUMENTS

| JP | A 08-250745 | 9/1996 |
| JP | A 2000-214477 | 8/2000 |
| JP | A-2001-326068 | 11/2001 |
| JP | A-2002-258765 | 9/2002 |
| JP | A-2003-057677 | 2/2003 |
| JP | A-2003-121875 | 4/2003 |
| JP | A-2003-280543 | 10/2003 |
| JP | A-2003-323160 | 11/2003 |

* cited by examiner

*Primary Examiner*—Huyen Ngo
(74) *Attorney, Agent, or Firm*—Oliff & Berridge, PLC

(57) ABSTRACT

To realize a high performance display at a low cost and a high mounting yield of the driving circuit. An electro-optical device according to the present invention comprises an element substrate having a plurality of pixels and a plurality of data lines electrically connected to the plurality of pixels, a circuit substrate piece mounted on the element substrate and having a first circuit which is connected to the plurality of data lines and has a plurality of thin film transistors, and an integrated circuit mounted on the circuit substrate piece and having a second circuit which is connected to the first circuit for driving the plurality of pixels via the first circuit and the plurality of data lines.

11 Claims, 13 Drawing Sheets

ELECTRO-OPTICAL DEVICE AND ELECTRONIC APPARATUS

BACKGROUND

The present invention relates to an electro-optical device such as a liquid crystal device and an electronic apparatus comprising the same, such as a liquid projector.

Such electro-optical devices comprise, on an element substrate, a plurality of pixels and a driving circuit for driving the plurality of pixels, while active matrix driving electro-optical devices further comprise pixel switching elements serving as active elements for every pixel. In an electro-optical device such as a liquid crystal display formed by using a liquid crystal device, the structure of the plurality of pixels or the driving circuit usually varies depending on their sizes or performances thereof. Specifically, each pixel switching element in each of the plurality of pixels is made of amorphous silicon or low-temperature polysilicon according to the size or the performance of the liquid crystal display. Furthermore, the driving circuit is mounted on the element substrate as an IC (Integrated Circuit) or an LSI (Large Scale Integration), or the driving circuit is formed in such a way that circuit elements are formed on the element substrate by using the low-temperature polysilicon technique or technology. That is, various types of liquid crystal displays can be manufactured by selecting an appropriate technology from the IC, the LSI, the low-temperature polysilicon technology, and the amorphous silicon technology in view of their the technical properties.

Here, in the driving circuit for a liquid crystal device, if the circuit elements are made of the amorphous silicon, there is a possibility that the driving circuit will not properly operate due to the low current driving efficiency of the circuit. Therefore, the circuit elements may be formed by using the low-temperature polysilicon having higher current driving efficiency than the amorphous silicon, or alternatively the driving circuit may be formed with a plurality of pixels on the element substrate.

In addition, in Patent Document 1, a technology for providing a driving circuit which comprises, as circuit elements, transistors formed on a substrate different from the element substrate by using the low-temperature polysilicon is disclosed. Further, in Patent Document 2, another technology in which a substrate having formed with a driving circuit which has circuit elements formed by using the low-temperature polysilicon is mounted on another substrate, to reduce noise during the driving operation is disclosed.

[Patent Document 1] Japanese Unexamined Patent Application Publication No. 8-250745

[Patent Document 2] Japanese Unexamined Patent Application Publication No. 2000-214477

SUMMARY

However, the driving circuit manufactured by the above-mentioned technique which uses the low-temperature polysilicon typically has a complex structure and manufacturing processes, further its electrostatic resistance is also low. Accordingly, when the plurality of pixels and the driving circuit are formed on the same element substrate by using the low-temperature polysilicon technology as mentioned above, the manufacturing cost significantly increases and the defect in the pixels caused by the electrostatic discharge damage frequently occurs.

In the meantime, according to the technique disclosed in Patent Document 1 or Patent Document 2, the layout size of the driving circuits formed on separate substrates by the low-temperature polysilicon technology becomes large, while or on the other hand the layout size is almost similar to that of the case when the driving circuit is mounted with ICs or the LSIs. In addition, since the driving circuits formed on the separate substrates have poor electrostatic resistance, if there is no protection against the static electricity, it is difficult to control the driving circuits. Therefore, the driving circuits are susceptible to the damages caused by the static electricity. Further, there is also a possibility that the driving circuit will not operate properly due to the damage.

The present invention is made in consideration of the above problems, and it is an object of the present invention to provide an electro-optical device and an electronic apparatus comprising the same in which the electro-optical device is capable of achieving a high performance display by utilizing the technical property of the ICs, the LSIs, the low-temperature polysilicon technology, or the amorphous technology.

In order to solve the afore-mentioned problems, the electro-optical according to the present invention comprises an element substrate having a plurality of pixels and a plurality of data lines electrically connected to the plurality of pixels, a circuit substrate piece mounted on the element substrate and having a first circuit which is connected to the plurality of data lines and has a plurality of thin film transistors, and an integrated circuit mounted on the circuit substrate piece and having a second circuit which is connected to the first circuit for driving the plurality of pixels via the first circuit and the plurality of data lines.

In the electro-optical device according to the present invention, according to the driving modes, scanning lines, a common wiring line, a power line, a capacitive line, or the like are properly wired in the element substrate. Further, in the pixels, according to the driving modes, various electronic elements, electrodes or wiring lines such as one or a plurality of thin film transistors (hereinafter, referred to as TFT), thin film diodes (hereinafter, referred to as TFD), capacitors, or electrodes are arranged. Furthermore, the various electronic elements in the pixels may be formed by using the low-temperature polysilicon or the amorphous silicon.

The circuit substrate piece is mounted on the peripheral region in the element substrate. In the present invention, the term 'to be mounted' means to physically fix with a predetermined shape, such as to adhere or bond by using a heat-pressing, a welding, or an adhesive. In this case, it indicates mainly a surface bonding or a surface adhesion between the mount surface of the circuit substrate piece and the mount surface of the element substrate, but it is not limited thereto.

On the circuit substrate piece, a first circuit which is connected to a plurality of data lines is formed by using the low-temperature polysilicon technology. In the present invention, the term 'be connected to the plurality of data lines' means a broadly-defined connection including an indirect electrical connection via other electrical circuit such as a buffer circuit, a level shifter circuit, a sampling circuit, in addition to a direct electrical connection.

Further, in the circuit substrate piece, an integrated circuit is COG (Chip On Glass) mounted as chips packaged as an IC or an LSI. Preferably, on the circuit substrate piece, a wiring line for connecting the first circuit and the integrated circuit is formed by using the low-temperature polysilicon technology. According to the above structure, it is possible to freely wire the wiring lines on the circuit substrate piece.

A broadly-defined driving circuit in the electro-optical device according to the present invention includes the integrated circuit and the first circuit. A second circuit in the integrated circuit generates predetermined types of signals for driving the plurality of pixels or the plurality of data lines on the element substrate. The predetermined types of signals are supplied to the plurality of data lines via the first circuit, and supplied to the plurality of pixels by the plurality of data lines.

More specifically, the second circuit generates a precharge signal or a multiplex signal as the predetermined types of signals. On the circuit substrate piece, as the first circuit, any one of or all of a selector circuit and a precharge circuit having the plurality of switching elements formed by using thin film transistors by the low-temperature polysilicon technology are formed.

As mentioned above, according to the electro-optical device of the present invention, in the broadly-defined driving circuit, main parts for generating the predetermined types of signals are mounted on the circuit substrate piece, as an integrated circuit, and a part of the broadly-defined driving circuit is formed on the circuit substrate piece by the low-temperature polysilicon technology.

Accordingly, compared to the case that the broadly-defined driving circuit is formed with the IC or the LSI and the IC or the LSI is mounted on the element substrate, it is possible to reduce the number of the IC or the LSI needed to construct the data line driving circuit.

In addition, by mounting the circuit substrate piece on the element substrate, the data line driving circuit is connected to a plurality of data lines. The IC or the LSI which is a main part of the broadly-defined driving circuit is connected to the plurality of data lines via the first circuit. Accordingly, compared to the case that the entire broadly-defined driving circuit is formed with the IC or the LSI, it is possible to connect electrically the broadly-defined driving circuit and the electro-optical panel with a simple.

Since the main parts of the broadly-defined driving circuit are formed with the IC or the LSI, the broadly-defined driving circuit can be realized as a high performance circuit. Further, by forming the thin film transistor in a large area by using the technical property of the low-temperature polysilicon technology, it is possible to manufacture the first circuit which is a part of the broadly-defined driving circuit on the circuit substrate piece. In addition, a plurality of pixels can be formed by using the low-temperature polysilicon technology or the amorphous silicon technology. Therefore, the intelligent and high performance liquid crystal device can be realized by using the technical property of the IC, the LSI, the low-temperature polysilicon technology or the amorphous silicon technology.

In addition, compared to the case that the entire broadly-defined driving circuit is formed on the circuit substrate piece by using the low-temperature polysilicon technology, it is possible to improve the electrostatic resistance of a part of the broadly-defined driving circuit formed by using the low-temperature polysilicon technology. As a result, when manufacturing the data line driving circuit, it is possible to realize the broadly-defined driving circuit with a limited inferior quality to subsequently increase the manufacturing yield of the liquid crystal device.

As mentioned above, according to the electro-optical device of the present invention, along with the advantages of having a small IC or LSI, it is possible to realize means capable of effectively transmitting a predetermined signal to a large screen by using the low-temperature polysilicon technology. According to the above technology, without any complex mounting process, it is possible to provide a simple display device at a low cost. Further, even in display devices having a medium or small screen, the present invention effectively enables a small wiring line interval to be realized with a high precision.

According to one aspect of the electro-optical device of the present invention, the plurality of thin film transistors are formed by low-temperature polysilicon.

According to the above aspect, the thin film transistors can be formed in a large area by using the technical property of the low-temperature polysilicon technology.

In another aspect of the electro-optical device of the present invention, the electro-optical device further comprises a data line driving circuit having the first circuit and the integrated circuit.

According to the above aspect, while the data line driving circuit as the broadly-defined driving circuit is realized as a high performance circuit, the number of the IC or the LSI needed to construct the data line driving circuit can reduce. Further, it is possible to connect electrically the broadly-defined driving circuit and the electro-optical panel with a simple. Furthermore, compared to the case that the entire data line driving circuit is formed on the circuit substrate piece by using the low-temperature polysilicon technology, it is possible to improve the electrostatic resistance of a part of the data line driving circuit formed by using the low-temperature polysilicon technology.

In another aspect of the electro-optical device of the present invention, the first circuit has a selector circuit formed by some of the plurality of thin film transistors, and output ends of the some of the plurality of thin film transistors are connected to the plurality of data lines.

According to the above aspect, the predetermined types of signals generated by the second circuit in the integrated circuit are supplied to the plurality of data lines via the selector circuit. In this case, it is possible to control the supply timing of the predetermined types of signals to the respective data lines. For example, the selector circuit may be formed as a demultiplex circuit which demultiplexes multiplex signals generated as the predetermined types of signals by the second circuit to supply to the respective data lines. Further, since the thin film transistor forming the selector circuit may be a relative low performance element, compared to the case that the entire broadly-defined driving circuit is formed on the circuit substrate piece by using the low-temperature polysilicon technology, the broadly-defined driving circuit can be manufactured at a low cost. Further, in addition to the thin film transistors, by providing another circuit element, that is, storage capacitor, a hold circuit in which an output signal from the selector circuit is held for a predetermined period can be formed.

According to another aspect of the electro-optical device of the present invention, the first circuit further has a pre-charge circuit for precharging each of the data lines at a predetermined potential.

According to the above aspect, by previously supplying the precharge signal to the respective data lines to charge a parasitic capacitor, a potential of the data lines can be reset to a predetermined potential previous to supply an image signal. Therefore, when the image signal is supplied to the respective data lines by the selector circuit, the image signal is satisfactorily written on the data lines.

According to another aspect of the electro-optical device of the present invention, the first circuit further has an electrostatic protective circuit.

According to the above aspect, the electrostatic resistance of a part of the broadly-defined driving circuit formed by the low-temperature polysilicon technology can be improved.

In another aspect of the electro-optical device of the present invention, the integrated circuit is COG-mounted on the circuit substrate piece.

According to the above aspect, after the integrated circuit is packaged as the IC or the LSI, the integrated circuit can be mounted on the circuit substrate piece, as a chip in a face-down manner or a face-up manner.

In another aspect of the electro-optical device of the present invention, the integrated circuit is connected to the circuit substrate piece after being mounted on a wiring substrate having an FPC (Flexible Printed Circuit).

According to the above aspect, the integrated circuit formed as the chip is mounted on the wiring base including a flexible substrate of a rigid substrate. Therefore, by mounting the wiring base on the circuit substrate piece, the integrated circuit can be mounted on the circuit substrate piece.

According to another aspect of the electro-optical device of the present invention, the pixels have pixel-switching thin film transistors formed by using amorphous silicon or low-temperature polysilicon.

According to the above aspect, the electro-optical device can be active-matrix-driven. Further, when a hold circuit is provided with respect to the selector circuit, or a precharge circuit is provided, the image signal is satisfactorily written on the respective data lines. Therefore, when the amorphous silicon technology is used, the pixel switching thin film transistors can be formed in a large area. Especially, by forming the circuit substrate piece with the low-temperature polysilicon and forming the pixels with the amorphous silicon, the electro-optical device can be effectively manufactured at a low cost.

Specifically, even in the case of forming the pixel switching thin film transistor by the low-temperature polysilicon technology, and demultiplexing the multiplex signal in the selector circuit to supply to the respective data lines, the image signals can be satisfactorily written in the respective pixels. Further, by providing an electrostatic protective circuit even in the plurality of data lines, the electrostatic resistance of the respective data lines can be improved.

According to another aspect of the electro-optical device of the present invention, the first circuit is connected to the plurality of data lines by a conductive adhesive having conductive beads.

According to the above aspect, by using an adhesive in which the conductive beads are dispersed in a resin or an adhesive film in which the conductive beads are dispersed in a film, the first circuit and the plurality of data lines are electrically connected to each other by the conductive beads, and the circuit substrate piece can be adhered to the element substrate.

In order to solve the above problems, the electronic apparatus according to the present invention comprises the afore-mentioned electro-optical device (including the various aspects).

Since the electronic apparatus according to the present invention comprises the afore-mentioned electro-optical device, it is possible to realize various intelligent electronic apparatuses such as a projection display device, a television, a mobile phone, an electronic organizer, a word processor, a view finder type or monitor direct view type video tape recorder, a workstation, a videophone, a POS terminal, or a touch panel, with a high performance by using a technical property of the IC, the LSI, the low-temperature polysilicon technology, or the amorphous silicon technology. Further, as the electronic apparatus of the present invention, it is possible to realize an electrophores device such as an electronic paper or an electron emission device (Field Emission Display and Conduction Electron-Emitter Display).

Operations or advantages of the present invention will be obvious from embodiments explained hereinafter.

DETAILED DESCRIPTION OF EMBODIMENTS

Hereinafter, the embodiments of the present invention will be explained with reference to the drawings. In the following embodiments, electro-optical devices of the present invention are applied to liquid crystal devices.

1: First Embodiment

A first embodiment of the electro-optical device according to the present invention will be explained with reference to FIGS. 1 to 9. Here, TFT-active matrix driving liquid crystal device is cited as an example.

<1-1: Entire Structure of Electro-Optical Panel>

The entire of the liquid crystal panel cited as an electro-optical panel in the liquid crystal device of the electro-optical device of the present invention will be explained with reference to FIGS. 1 and 2. Here, FIG. 1 is a schematic plan view showing the liquid crystal panel when an element substrate is viewed from the respective components formed thereon and the counter substrate side, and FIG. 2 is a schematic cross-sectional view taken along the line H-H' of FIG. 1.

Figure 1:
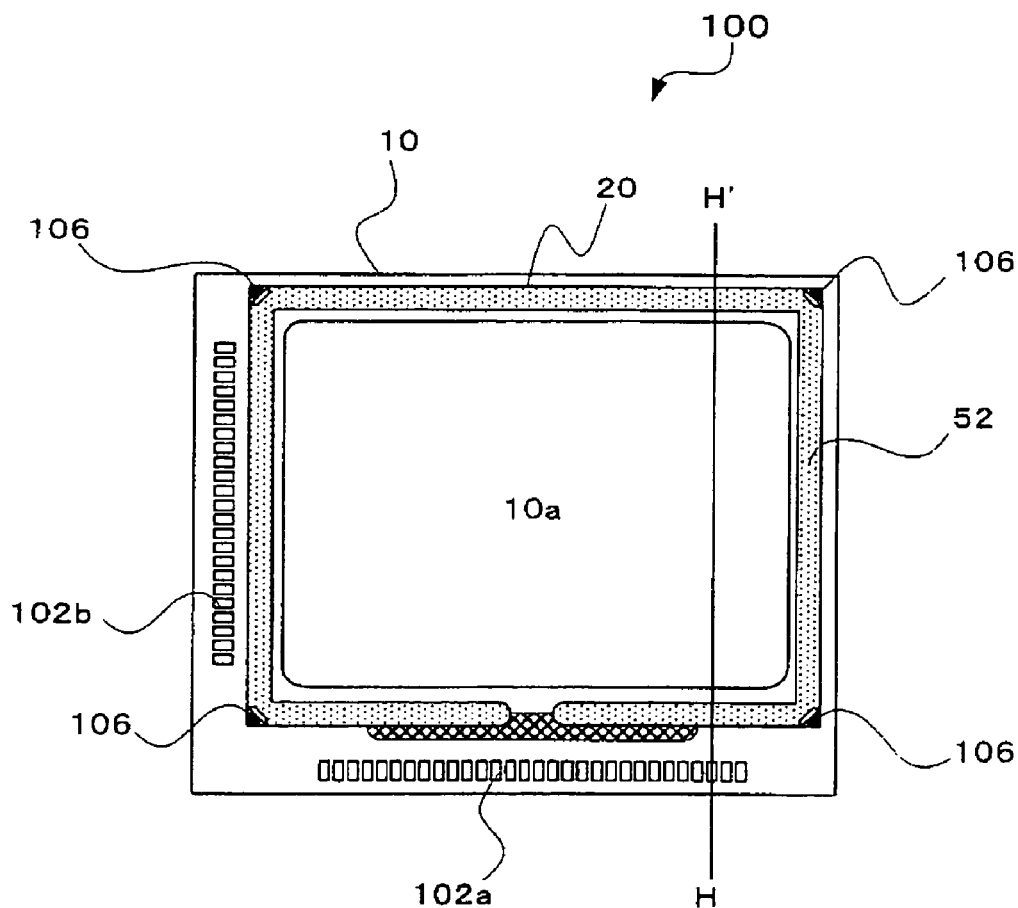
FIG. 1 is a schematic plan view showing a liquid crystal panel according to a first embodiment of the present invention.
Figure 2:
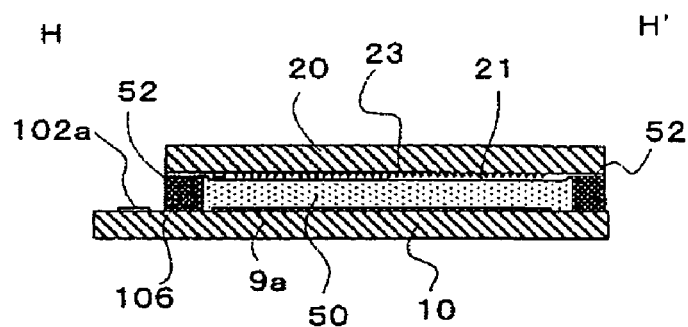
FIG. 2 is a cross-sectional view taken along the line H-H' of FIG. 1.

In FIGS. 1 and 2, in the liquid crystal panel 100 according to the present invention, the element substrate 10 and the counter substrate 20 oppose to each other. A liquid crystal layer 50 is sealed between the element substrate 10 and the counter substrate 20, and the element substrate 10 and the counter substrate 20 are bonded to each other by a sealing material 52 provided in a sealing region disposed in the periphery of an image display region 10a.

The sealing material 52 is made of ultraviolet curing resin or thermo-setting resin, and is used for bonding both substrates. In the manufacturing process, the sealing material is applied on the element substrate 10, and is hardened by irradiating ultraviolet rays or heating it. Further, in the sealing material 52, gap materials such as glass fiber or glass beads are dispersed in order to make the interval (gap between substrates) between the element substrate 10 and the counter substrate 20 have a predetermined value.

In the present embodiment, a peripheral region is positioned around the image display region 10a. In a portion of the peripheral region on the element substrate 10 outside the sealing region in which the sealing material 52 is provided, a plurality of the first connecting terminals 102a are arranged along one side of the element substrate 10. Further, along one or two sides adjacent to the one side, a plurality of the second connecting terminals 102b are arranged. In FIG. 1, between the two sides adjacent to the one side of the element substrate 10 where the plurality of first connecting terminals 102a are arranged, the plurality of second connecting terminals 102b are arranged along only one side. Here, as described below, data line driving circuits are provided for the plurality of first connecting terminals 102a with circuit substrate pieces. Furthermore, scanning line driving circuits are mounted for the plurality of second connecting terminals 102b by using a TAB (Tape Automated Bonding) method.

Upper and lower conductive materials 106 serving as upper and lower conductive terminals between the two substrate are provided at four corners of the counter electrode 21 formed on the entire surface of the counter substrate 20. In the meantime, upper and lower conductive terminals are provided in regions of the element substrate 10 corresponding to the corners. Therefore, the element substrate 10 and counter substrate 20 can be electrically connected to each other.

In FIG. 2, on the element substrate 10, an alignment film is formed on pixel electrodes 9a which have pixel switching TFTs, or wiring lines such as scanning lines or data lines formed thereon. To the contrary, in addition to the counter electrode 21, the counter substrate 20 has color filters which are arranged in a stripe shape, a mosaic shape, or a triangle shape, a metal material such as chrome, or nickel, a black matrix 23 such as a resin black in which carbon or titanium is dispersed in a photoresist, and an alignment film formed on a uppermost layer. Further, a liquid crystal layer 50 is made of liquid crystal in which one or several kinds of nematic liquid crystals are mixed, and has a predetermined alignment state between the pair of alignment films.

<1-2: Structure of Electro-Optical Device>

Next, the structure of each part of liquid crystal device of the present invention will be explained with reference to FIGS. 3 to 8.

Figure 3:
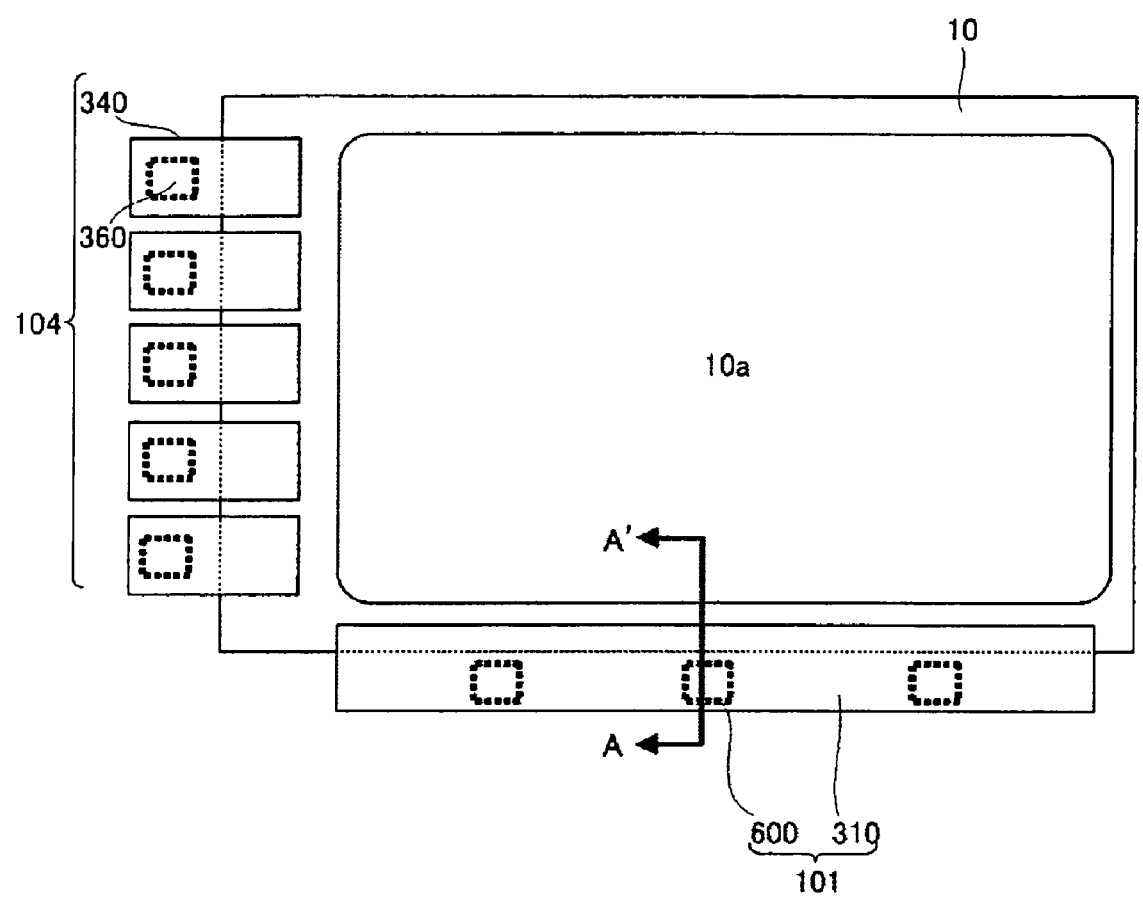
FIG. 3 is a schematic plan view showing a of an element substrate in a liquid crystal device according to a first embodiment of the present invention.

In the present embodiment, main parts of the liquid crystal device include a liquid crystal panel 100, a data line driving circuit 101, and a scanning line driving circuit 104. Here, with reference to FIGS. 3 to 5, the connecting relation between the data line driving circuit 101 and the scanning line driving circuit 104 and the liquid crystal panel 100 will be explained. FIG. 3 is a plan view showing schematically the of the element substrate 10 in the liquid crystal device, FIG. 4 is a cross-sectional vies taken along the line A-A' of FIG. 3, and FIG. 5 is a sectional view showing the of the main parts for the connection of the element substrate 10 and the circuit substrate piece.

In FIG. 3, on the element substrate 10, the circuit substrate piece 310 is attached to the plurality of first connecting terminals 102a. The circuit substrate piece 310 has the first circuit manufactured by using the low-temperature polysilicon technology therein, and on the circuit substrate piece 310, a plurality of chips 600 including ICs or LSIs as an integrated circuit according to the present invention are COG-mounted. The data line driving circuit 101 has the plurality of chips 600 and the first circuit.

Further, the scanning line driving circuit 104 is formed on a plurality of flexible substrates 340 having various ICs or LSIs mounted thereon, to the plurality of second connecting terminals 102b. On the flexible substrates 340, a plurality of wiring lines (not shown in FIG. 3) are formed, ends of the plurality of wiring lines are connected to the ICs or the LSIs, the other ends thereof are connected to the second connecting terminals 102b. Moreover, it is preferable that the ICs or the LSIs be COG-mounted on the plurality of second connecting terminals 102b to form the scanning line driving circuit 104.

Figure 4:
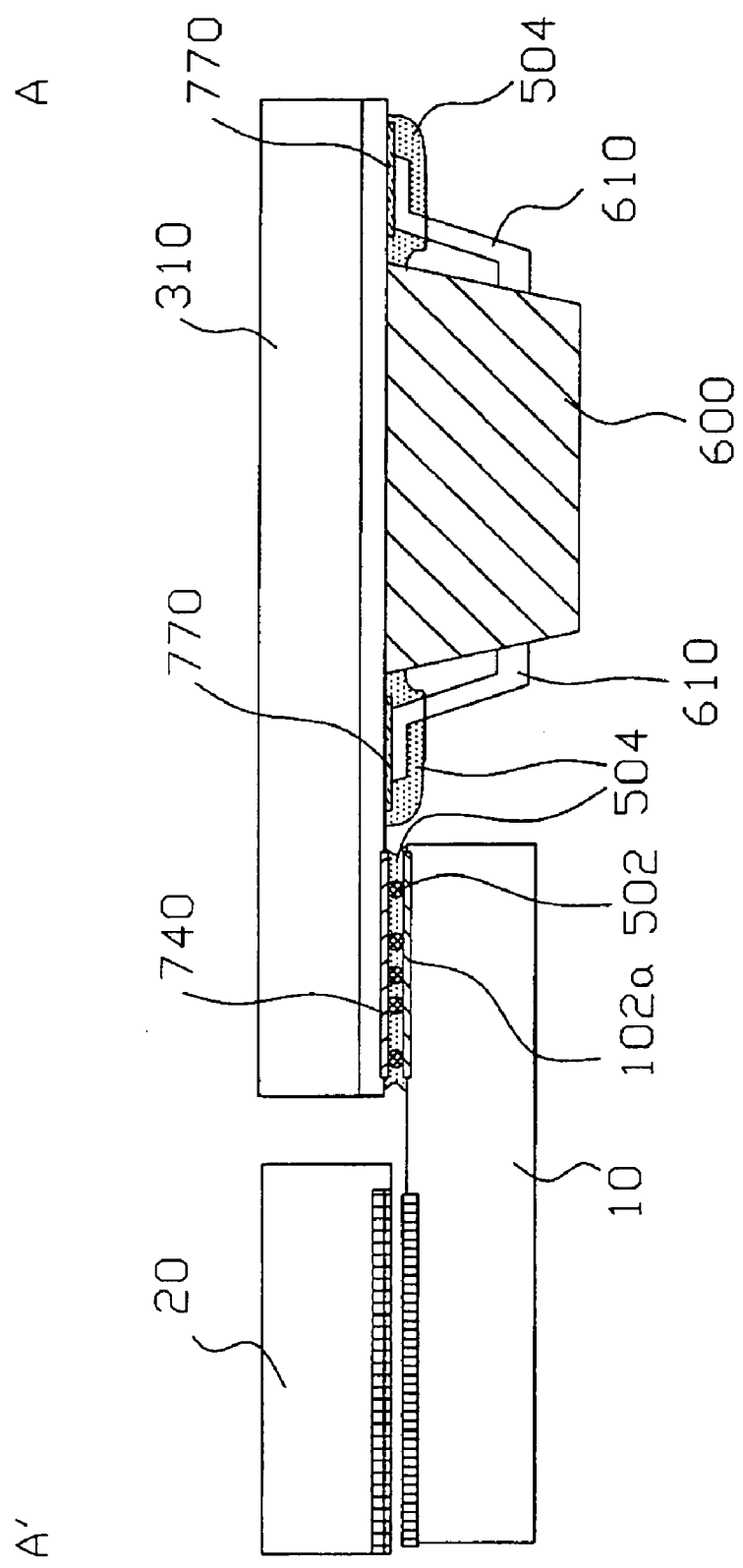
FIG. 4 is a cross-sectional view taken along the line A-A' of FIG. 3.
Figure 5:
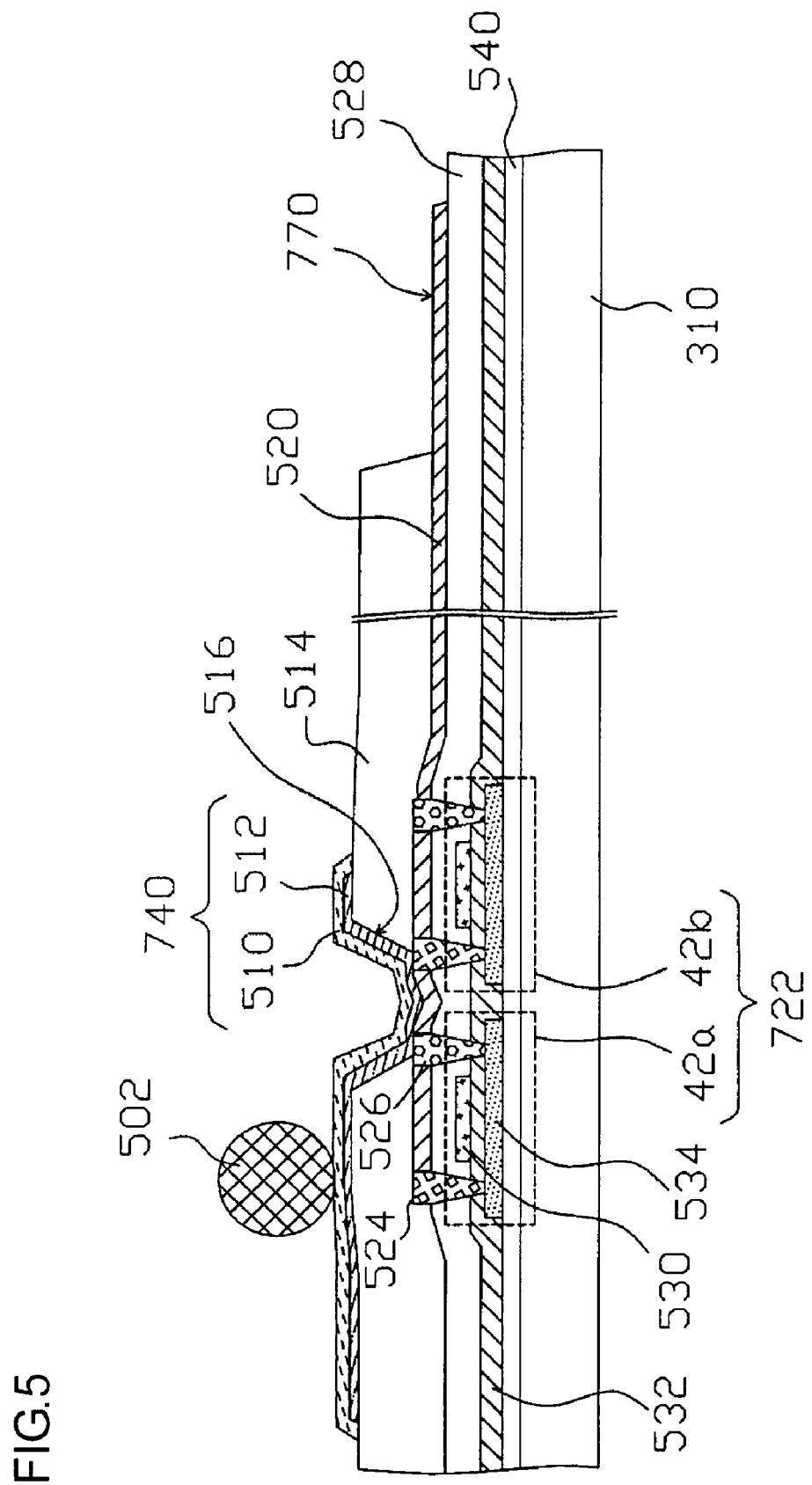
FIG. 5 is a cross-sectional view showing a of principle parts for connection of the circuit substrate piece and the element substrate.

Referring to FIGS. 4 and 5, a schematic structure of the circuit substrate piece 310, and the connection of the circuit substrate piece 310 and the element substrate 10 will be explained.

In FIG. 4, a plurality of third connecting terminals 740 and a plurality of fourth connecting terminals 770 electrically connected to the first circuit are provided on the circuit substrate piece 310. Leads 610 wired by the plurality of chips 600 are connected to the plurality of fourth connecting terminals 770 and thus the plurality of chips 600 are mounted in a face-up manner. In addition, the plurality of third connecting terminals 740 and the plurality of first connecting terminals 102a are bonded to each other by an adhesive 504 in which conductive beads are dispersed in the resin to mount the circuit substrate piece 310 on the element substrate 10. Further, the leads 610 wired by the plurality of chips 600 may be connected to the plurality of fourth connecting terminals 770 by the adhesive 504. Furthermore, the plurality of chips 600 may be mounted to the plurality of fourth connecting terminals 770 in a face-down manner.

In FIG. 5, the first circuit is formed in such a manner that an underlying insulating layer 540 is formed on the circuit substrate piece 310 and various circuit elements and wiring lines are formed on the underlying insulating layer 540. In FIG. 5, on the underlying insulating layer 540, n-channel MOS (Metal-Oxide-Semiconductor) TFT 42a and p-channel MOS TFT 42b are formed by a semiconductor layer 534 formed by using the low-temperature polysilicon, a gate insulating layer 532 having the semiconductor layer 534 embedded therein, and a gate electrode 530 which is formed correspondingly to the semiconductor layer 534 on the gate insulating layer 532. As a circuit element, a switching element 722 is formed by a CMOS comprising the n-channel MOS TFT 42a and p-channel MOS TFT 42b.

An interlayer insulating layer 528 is formed on the gate insulating layer 532, a source electrode 524 and a drain electrode 526 are formed through the interlayer insulating layer 528 for the n-channel MOSTFT 42*a* and the p-channel MOSTFT 42*b*, respectively. Therefore, on the interlayer insulating layer 528, a wiring line 520 which is electrically connected to the source electrode 524 and the drain electrode 526. In here, a part of the wiring line 520 which is exposed on the interlayer insulating layer 528 becomes the fourth connecting terminal 770 shown in FIG. 4.

In addition, the interlayer insulating layer 514 is formed on a conductive film which forms the wiring line 520 and a contact hole 516 is formed to reach a surface of the conductive film 520 through the interlayer insulating layer 514. A metal film 512 and an ITO (Indium Tin Oxide) film 510 for protecting the metal film 512 are continuously formed so as to cover a surface of the conductive film 520 which is exposed by the contact hole 516, a side wall of the contact hole 516, and the interlayer insulating layer 514. The third connecting terminal 740 comprises the metal film 512 and the ITO film 510.

Here, when the plurality of third connecting terminals 740 and the plurality of first connecting terminals 102*a* are bonded to each other, the plurality of third connecting terminals 740 are electrically connected to the plurality of first connecting terminals 102*a* by the conductive beads 502.

In addition, according to the afore-mentioned of the circuit substrate piece 310, the wiring lines 520 or leads 610 formed by using the low-temperature polysilicon technology are easily wired on the circuit substrate piece 310.

Figure 6:
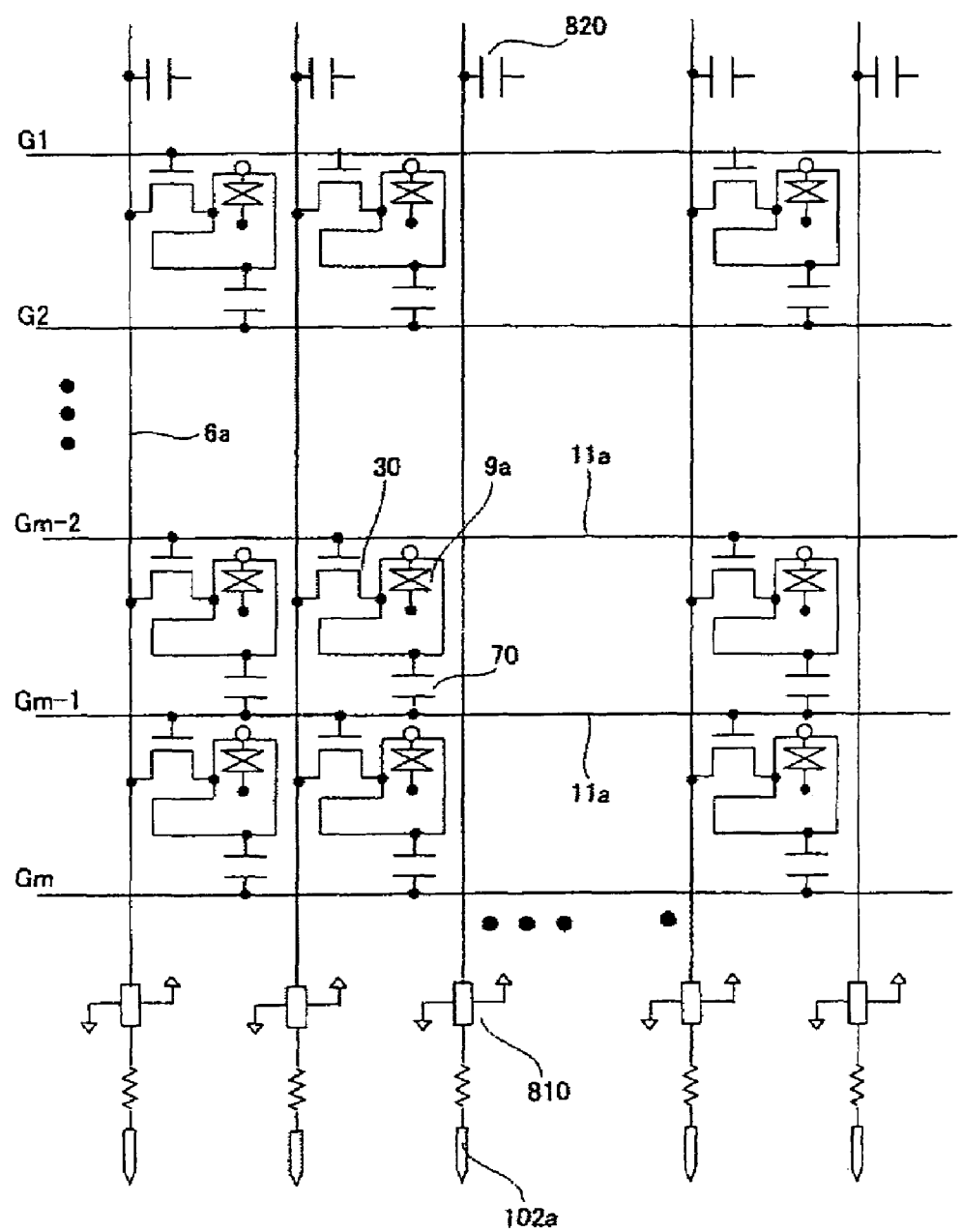
FIG. 6 is a circuit diagram showing various elements or wiring lines in a plurality of pixels.

Next, referring to FIG. 6, the circuit of a plurality of pixels in an image display region 10*a* of a liquid crystal panel 100 will be explained. FIG. 6 is a circuit diagram showing various elements or wiring lines in the plurality of pixels.

The liquid crystal panel 100 comprises, in the image display region 10*a*, data lines 6*a* and scanning lines 11*a* which are wired in vertical and horizontal directions, respectively. For every pixel corresponding to intersections of the data lines and the scanning lines, pixel electrodes 9*a* which are arranged in a matrix and pixel switching TFTs 30 for switching the pixel electrodes 9*a* are provided.

In this embodiment, especially, the total number of the scanning lines 11*a* is m (m is a natural number greater than or equal to 2), and the total number of the data lines 6*a* is 3×n (n is a natural number greater than or equal to 1). Further, in the image display region 10*a*, three types of R, G, and B data lines 6*a* are provided and the three of R, G, and B data lines 6*a* form a data line group. Image signals are output for one data line group during one scanning selection period, as described below.

In FIG. 6, the data lines 6*a* to which image signals are supplied are electrically connected to the source electrodes of the pixel switching TFTs 30, the scanning lines 11*a* are electrically connected to the gate electrodes of the pixel switching TFTs 30, and the pixel electrodes 9*a* are connected to the drain electrodes of the pixel switching TFT 30. Therefore, each of the pixels have the pixel electrodes 9*a*, the counter electrode 21 formed on the counter substrate 20, and liquid crystal interposed between the two electrodes to be arranged in a matrix, corresponding to the intersections of the scanning lines 11*a* and the data lines 6*a*.

In order to prevent to leak the stored image signal, a storage capacitor 70 is formed parallel to liquid crystal capacitor formed between the pixel electrodes 9*a* and the counter electrode 21. For example, since the voltage of the pixel electrode 9*a* is held by the storage capacitor 70 for the time 3 digits longer than the time when the source voltage is applied, it is possible to attain the high contrast ratio due to the improvement of the storage property.

In FIG. 6, each of the data lines 6*a* is connected to the first connecting terminals 102*a* via an electrostatic protective circuit 810.

The pixel switching TFT 30 may be formed by using the low-temperature polysilicon or amorphous silicon. When the pixel switching TFT 30 is formed by using the low-temperature polysilicon, it is possible to improve the electrostatic resistance in each pixel by the electrostatic protective circuit 810 formed in the respective data lines 6*a*.

Figure 7:
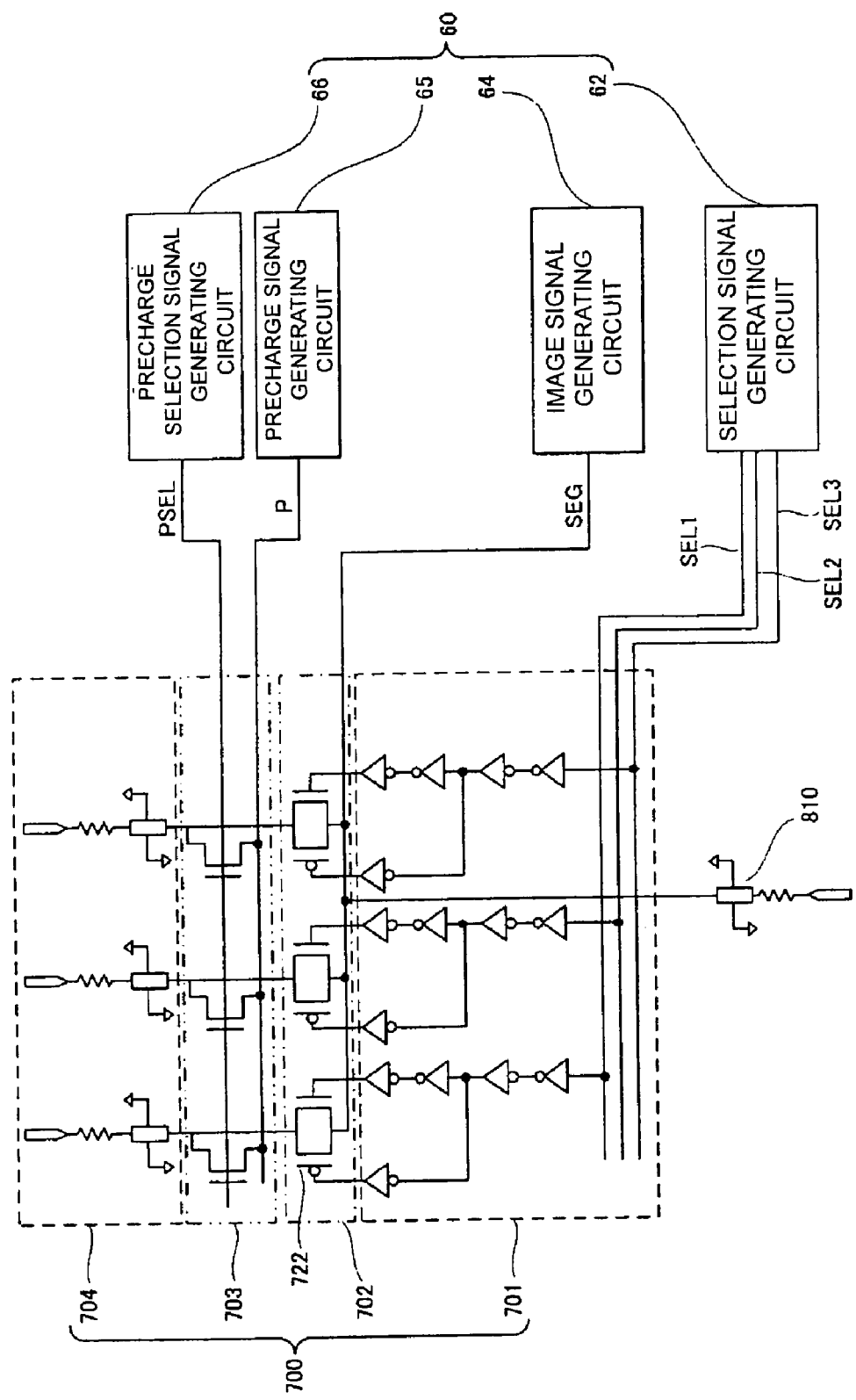
FIG. 7 is a block diagram showing an entire circuit on the circuit substrate piece.
Figure 8:
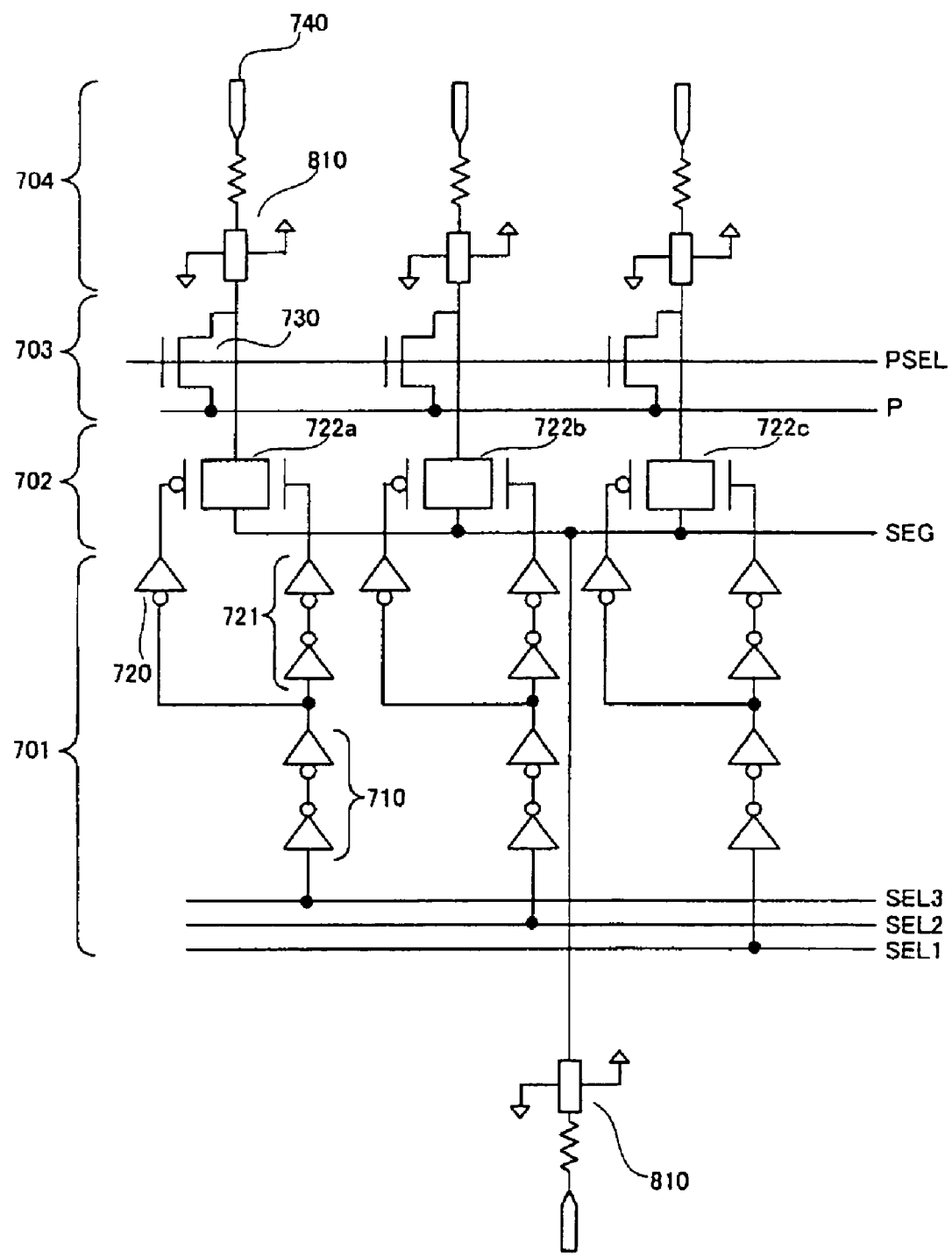
FIG. 8 is a circuit diagram showing a of a first circuit.

Next, the of a circuit on the circuit substrate piece 310 will be explained with reference to FIGS. 7 and 8. FIG. 7 is a block diagram showing an entire circuit on the circuit substrate piece 310, and FIG. 8 is a circuit diagram showing a of the first circuit.

A second circuit 60 shown in FIG. 7 is formed in the IC or the LSI in the plurality of chips 600. The second circuit 60 comprises a selection signal generating circuit 62, an image signal generating circuit 64, a precharge signal generating circuit 65, and a precharge selection signal generating circuit 66.

The selection signal generating circuit 62 generates three types of selection signals SEL1, SEL2, and SEL3 during one scanning selection period to output it.

Here, in the image display region 10*a* of the liquid crystal panel 100, 3×n data lines 6*a* are divided into n data line groups each having three data lines 6*a*. In order to drive the n data line groups, the image signal generating circuit 64 generates n types of multiplex signal SEG based on the input image data supplied to the liquid crystal device to output it. According to this embodiment, the multiplex signal SEG is time-division-multiplexed.

The precharge signal generating circuit 65 generates a precharge signal P for precharging previously the data lines 6*a* at a predetermined potential when the liquid panel 100 is driven to output it. Further, the precharge selection signal generating circuit generates a precharge selection signal PSEL to output it.

Various signals generated from the second circuit 60 are supplied to the first circuit 700 formed on the circuit substrate piece 310 via the plurality of fourth connecting terminals 770 and wiring lines 520 shown in FIG. 4. In FIG. 7, the first circuit 700 comprises a selector circuit 702, a precharge circuit 703, a signal input unit 701 which inputs three selection signals SEL1, SEL2, and SEL3 to the selector circuit 702, and a signal output unit 704 which outputs various output signals to the liquid crystal panel 100. The selector circuit 702 comprises 3×n switching elements 722 corresponding to 3×n data lines 6*a*.

The of the selector circuit 702, the precharge circuit 703, the signal input unit 701, and the signal output unit 704 corresponding to a group of data lines is shown in FIG. 8.

The selector circuit 702 comprises three types of switching elements 722*a*, 722*b*, and 722*c*, specifically, R switching element 722*a* corresponding to R data line 6*a*, G switching element 722*b* corresponding to G data line 6*a*, and B switching element 722*c* corresponding to B data line 6*a*.

The three types of selection signals SEL1, SEL2, and SEL3 corresponding to the three types of switching elements 722*a*, 722*b*, and 722*c* are supplied to the signal input unit 701. In addition, the signal input unit 701 comprises two buffer circuits 710, 721 and an inverter circuit 720 which correspond to the three switching elements 722*a*, 722*b*, 722*c*, respectively. The three types of selection signals SEL1, SEL2, and SEL3 are input to one buffer circuit 710 of the two buffer circuits. An output signal of the one buffer circuit 710 is input to the other buffer circuit 721 and the inverter circuit 720.

Therefore, output signals from the other buffer circuit 721 and the inverter circuit 720 are input to the three switching elements 722a, 722b, 722c. Further, a multiplex signal SEG from the second circuit 60 is supplied to the three switching elements 722a, 722b, 722c.

The G switching element 722b and the B switching element 722c have the same structure as the R switching element 722a. Focused on the R switching element 722a, in the CMOS composing the R switching element 722a, the output signals of the buffer circuit 721 and the inverter circuit 720 are input to gate electrodes of two TFTs, and the multiplex signals SEG are input to source electrodes of the two TFTs. Further, drain electrodes of the two TFTs are electrically connected to the third connecting terminals 740 via the electrostatic protective circuit 810.

The precharge circuit 703 comprises 3×n switching elements 730 corresponding to 3×n data lines 6a. FIG. 8 shows an example that the 3×n switching elements 730 are p-channel TFTs.

In the precharge circuit 703, a precharge signal P from the second circuit 60 is supplied to a source electrode of each of the switching elements 730, and a precharge selection signal PSEL from the second circuit 60 is supplied to a gate electrode of each of the switching elements 730. Drain electrodes of the switching elements 730 are electrically connected to the third connecting terminals 740 via the electrostatic protective circuit 810.

The signal output unit 704 comprises the plurality of third connecting terminals 740 corresponding to the plurality of first connecting terminals 102a and the electrostatic protective circuit 810 which is electrically connected to the plurality of third connecting terminals 740. Further, in the first circuit 700, the electrostatic protective circuit 810 may be electrically connected to the respective signal lines to which output signals from the second circuit 60 are supplied. By providing the above electrostatic protective circuit 810, it is possible to improve electrostatic resistance in the first circuit 700.

As mentioned above, according to the present embodiment, in the data line driving circuit 101, the plurality of chips 600 having the second circuit 60 which generates the multiplex signal SEG or the precharge signal P are mounted on the circuit substrate piece 310, and the first circuit 700 is formed on the circuit substrate piece 310 by using the low-temperature polysilicon technology.

Accordingly, compared to the case that the entire data line driving circuit 101 is formed with the ICs or the LSIs and the IC or the LSIs are mounted on the element substrate 10, it is possible to reduce the number of the ICs or the LSIs needed to construct the data line driving circuit.

In addition, by mounting the circuit substrate piece 310 on the element substrate 10, the data line driving circuit 101 is connected to the 3×n data lines 6a. The plurality of chips 600 which are main parts of the data line driving circuit 101 are connected to the 3×n data lines 6a via the first circuit 700. Accordingly, compared to the case that the entire data line driving circuit 101 is formed with the ICs or the LSIs, it is possible to connect electrically the data line driving circuit 101 and the liquid crystal panel 100 with a simple .

Since the main parts of the data line driving circuit 101 comprises the plurality of chips 600, it is possible to realize the data line driving circuit 101 as a high performance circuit. Further, by forming the thin film transistor in a large area by using the technical property of the low-temperature polysilicon, it is possible to manufacture the first circuit 700 on the circuit substrate piece 310. In addition, it is further possible to form a plurality of pixels in the liquid crystal panel 100 by using the low-temperature polysilicon technology or the amorphous silicon technology. Therefore, the simple and high performance liquid crystal device can be realized by using the technical property of the IC, the LSI, the low-temperature polysilicon technology or the amorphous silicon technology.

In addition, compared to the case that the entire data line driving circuit 101 is formed on the circuit substrate piece 310 by using the low-temperature polysilicon technology, it is possible to improve the electrostatic protection resistance of a part of the data line driving circuit 101, that is, of only the first circuit 700 formed by using the low-temperature polysilicon technology. As a result, when manufacturing the data line driving circuit 101, it is possible to realize a circuit with a limited inferior quality to subsequently increase the manufacturing yield of the liquid crystal device.

As mentioned above, according to the electro-optical device of the present invention, along with the advantages of having a small IC or LSI, it is possible to realize means capable of effectively transmitting a predetermined signal to a large screen by using the low-temperature polysilicon technology. According to the above technology, without any complex mounting process, it is possible to provide a simple display device at a low cost. Further, even in display devices having a medium or small screen, the present invention effectively enables a small wiring line interval to be realized with a high precision.

<1-3: Operation of Electro-Optical Device>

Figure 9:
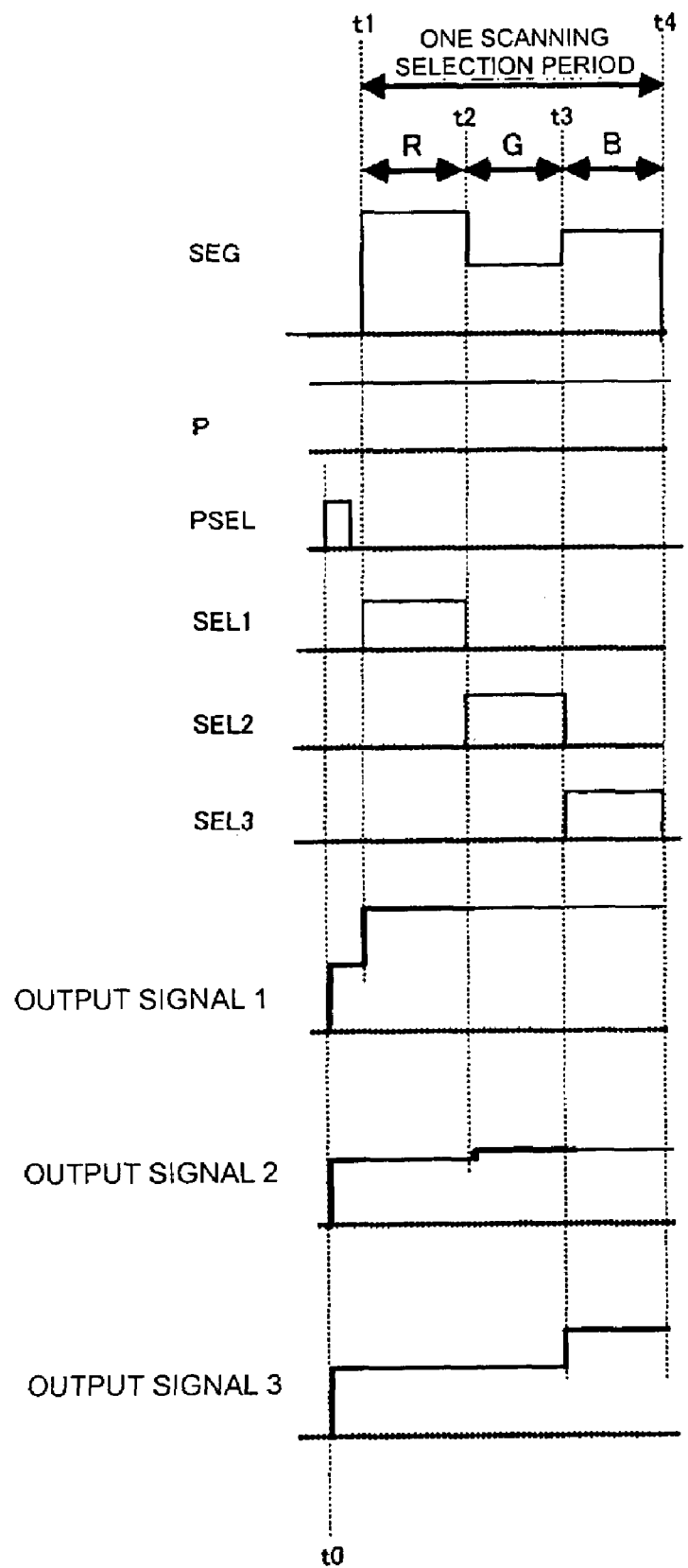
FIG. 9 is a timing chart showing an operation of the liquid crystal device.

Referring to FIGS. 1 to 3, FIGS. 6 to 8, and FIG. 9, the operation of the liquid crystal device will be explained. FIG. 9 is a flow chart showing the operation of the liquid crystal device.

The m scanning lines 11a shown in FIG. 6 are electrically connected to the scanning line driving circuit 104 shown in FIG. 3 via the plurality of second connecting terminals 102a shown in FIG. 1. Here, when driving the liquid crystal device, scanning signals G1, G2, . . . , Gm-2, Gm-1, Gm are line-sequentially applied from the scanning line driving circuit 104 to the m scanning lines 11a in this order at a predetermined timing as pulses. In the pixels corresponding to the respective scanning lines 11a, the scanning signals G1, G2, . . . , Gm-2, Gm-1, Gm are supplied to the gate electrodes of the pixel switching TFTs 30. One scanning selection period in the respective pixels is defined by the corresponding scanning signals G1, G2, . . . , Gm-2, Gm-1, Gm.

In FIG. 9, the precharge signal P from the precharge signal generating circuit 65 is at a high level at a time t0, and the precharge selection signal PSEL is output from the precharge signal generating circuit 65 to be at a high level. In the precharge circuit 703, the precharge signal P is output from the third connecting terminals 740 via a switching element 730 while in its ON state. Accordingly, output signals 1, 2, 3 output from the third connecting terminals 740 shown in FIG. 9 are at a high level. The precharge signal P output from the third connecting terminals 740 is supplied to the data lines 6a via the first connecting terminals 102a . As shown in FIG. 6, the respective data lines 6a have parasitic capacitors 820. Before starting the one scanning selection period, by supplying the precharge signal P to the respective data lines 6a, the parasitic capacitors 820 are charged by the precharge signal P to reset the respective data lines 6a.

Next, the operation of the selector circuit 702 will be explained. At a time t1, a scanning signal Gj (j=1, 2, ..., m-2, m-1, m) is applied to one scanning line 11*a* shown in FIG. 6, a pixel switching TFT 30 in a pixel corresponding to the scanning line 11*a* is in on state, and thus the one scanning selection period is selected.

The one scanning selection period is divided into three periods of R period, G period, and B period. Further, in FIG. 9, a period corresponding to the R period is represented as 'R', a period corresponding to the G period is represented as 'G', and a period corresponding to the B period is represented as 'B'.

Further, at the time t1, a multiplex signal SEG is output from the image signal generating circuit 64 and the multiplex signal SEG is at a high level. The multiplex signal SEG is a time division multiplexed signal, and includes first to third image signals to be supplied three data lines 6*a* in one data line group during one scanning selection period.

The time t1 is a time when R period starts, a potential of the multiplex signal SEG is at a level corresponding to the first image signal which is an R image signal. Further, at the time t1, R selection signal SEL1 among three selection signals SEL1, SEL2, SEL3 is output from the selection signal generating circuit 62 to be supplied to the R switching element 722*a*. When the R selection signal SEL1 is input to the R switching element, the R switching element is in On state, the multiplex signal SEG are demultiplexed by the R switching element 722*a*, and the first image signal is output from the third connecting terminal 740. Accordingly, at the time t1, a level of the output signal 1 which is output from the third connecting terminal 740 corresponding to the R switching element 722*a* is a level corresponding to the first image signal.

The first image signal is output into the R data line 6*a* from the third connecting terminal 740 via the first connecting terminal 102*a*. Therefore, the first image signal is written in the pixel which is previously selected by supplying the scanning signal Gj and corresponds to the R data line 6*a*.

Subsequently, when G period starts at a time t2, a potential of the multiplex signal SEG is at a level corresponding to the second image signal which is a G image signal. Further, at the time t2, G selection signal SEL2 is output from the selection signal generating circuit 62 to be supplied to the G switching element 722*b*. Therefore, similar to the first image signal, the second image signal is output from the third connecting terminal 740 via the G switching element 722*b*. Accordingly, at the time t2, a level of the output signal 2 which is output from the third connecting terminal 740 corresponding to the G switching element 722*b* is a level corresponding to the second image signal. Further, similar to the first image signal, the second image signal is written in the pixel which is previously selected by supplying the scanning signal Gj and corresponds to the G data line 6*a*.

When B period starts at a time t3, a potential of the multiplex signal SEG is at a level corresponding to the third image signal which is a B image signal. Similar to the R or G switching element 722*a* or 722*b*, the B switching element 722*c* output the third image signal based on a B selection signal SEL3 supplied from the selection signal generating circuit 62. Accordingly, at the time t3, a level of the output signal 3 which is output from the third connecting terminal 740 corresponding to the B switching element 722*c* is a level corresponding to the third image signal. Further, the third image signal is written in the pixel which is previously selected by supplying the scanning signal Gj and corresponds to the B data line 6*a*.

Therefore, in the liquid crystal device, it is possible to display color images by the plurality of pixels. Further, according to the selector circuit 702 as mentioned above, it is further possible to control the supply timing of the first to third image signals to the respective data lines 6*a* by the three switching elements 722*a*, 722*b*, and 722*c*. Furthermore, on the circuit substrate piece 310, it is possible reduce the number of leads 610 or wiring lines 520 to which output signals from the plurality of chips 600 are supplied. As a result, it is possible to conveniently wire the wiring lines on the circuit substrate piece 310.

In addition to the above description, the case when the selector circuit 702 is a 1:3 selector, the image signal generating circuit 64 multiplexes the three image signals to generate the multiplex signal SEG, and thus the three data lines 6*a* are driven will be explained. However, the number of the data lines 6*a* which is driven by one multiplex signal SEG is not limited to three. The types of data line 6*a*, that is, the number of multiplexed image signals are preferably determined according to the capacitance of wiring lines such as the data lines 6*a* or the impedance of output signals from the data line driving circuit 101 to the plurality of data lines 6*a*.

For example, in 30-inch display device formed by the liquid crystal device, if the entire data line driving circuit 101 is formed with the IC or the LSI, 10 chips 600 are required. However, when a multiplex signal SEG is generated by multiplexing six image signals, and the six data lines 6*a* are driven by the one multiplex signal SEG, it is possible to constitute the data line driving circuit 101 by using only three chips 600.

The switching elements 722 and 730 forming the selector circuit 702 and the precharge circuit 703 may be a low performance element. Therefore, it is possible to manufacture the data line driving circuit 101 at a low cost, compared to the case that the entire data line driving circuit 101 is formed on the circuit substrate piece 310 by using the low-temperature polysilicon technology.

Further, any of the selector circuit 702 and the precharge circuit 703 may be formed in the first circuit 700. When the only selector circuit 702 is formed therein, the pixel switching TFTs 30 for the respective pixels of the liquid crystal panel 100 may be formed by using the low-temperature polysilicon. According to the above, the image signals are satisfactorily written in the respective pixels.

When the precharge circuit 703 is formed therein, the image signals can be reliably written on the data lines 6*a*. Therefore, if using the amorphous silicon technology, it is possible to form large-sized pixel switching TFTs 30, and to manufacture the liquid crystal device at a low cost.

2: Second Embodiment

A second embodiment according to the present invention will be explained. In the electro-optical device of the second embodiment, the and the operation of the selector circuit 702 in the first circuit 700 formed on the circuit substrate piece 310 is different from those of the first embodiment. Therefore, only parts of the and the operation of the selector circuit 702 different from those in the first embodiment will be described in detail with reference to FIGS. 10 and 11. Further, in FIGS. 10 and 11, the same parts as the first embodiment are designated by the same reference numbers, the description will be omitted.

Figure 10:
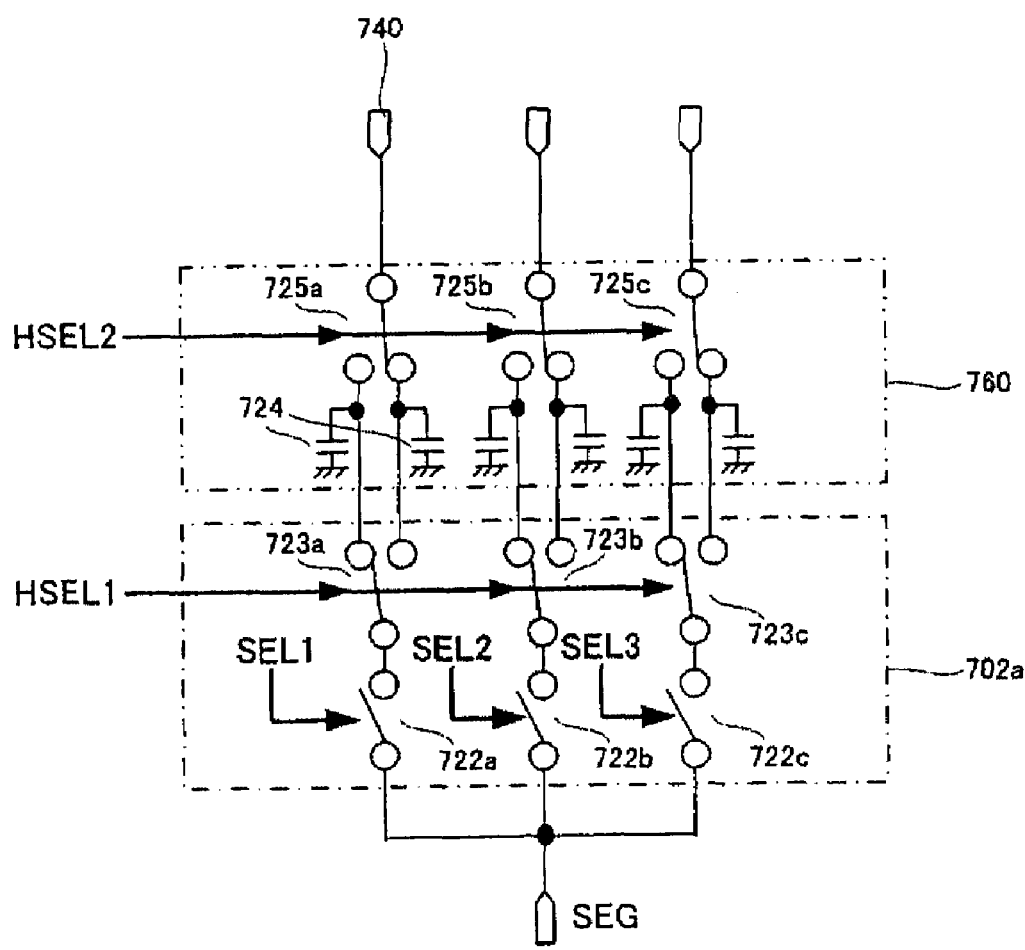
FIG. 10 is a circuit diagram showing a of a selector circuit according to a second embodiment.

FIG. 10 is a schematic circuit diagram showing a of the selector circuit 702*a* according to the second embodiment.

In the second embodiment, a hold circuit 760 is provided with respect to the selector circuit 702a.

In the selector circuit 702a, in addition to the three switching elements 722a, 722b, 722c, three hold-side selection switching elements 723a, 723b, 723c corresponding to the three switching elements 722a, 722b, 722c are provided.

In addition, in the hold circuit 760, with respect to each of the three hold-side selection switching element 723a, 723b, 723c, two storage capacitors 724 are provided, three output-side selection switching elements 725a, 725b, 725c corresponding to the three hold-side selection switching elements 723a, 723b, 723c are provided.

In the second embodiment, the selection signal generating circuit 62 in the second circuit 60 outputs a hold-side selection signal HSEL1 and an output-side selection signal HSEL2, in addition to the three selection signal SEL1, SEL2, SEL3. further, other than the signal generating circuit 62, a hold circuit driving circuit for outputting the hold-side selection signal HSEL1 and the output-side selection signal HSEL2 may be provided in the second circuit 60 or the first circuit 700.

In the selector circuit 702a, inputs of the three hold-side selection switching elements 723a, 723b, 723c are electrically connected to outputs of the three switching elements 722a, 722b, 722c. Each of outputs of the three hold-side selection switching elements 723a, 723b, 723c is electrically connected to the two storage capacitors 724.

The three hold-side selection switching elements 723a, 723b, 723c select a corresponding one of the two storage capacitors 724 based on the hold-side selection signal HSEL1 supplied from the second circuit 60.

In addition, in the hold circuit 760, the three output-side selection switching elements 725a, 725b, 725c select one of the two storage capacitors 724 in response to the output-side selection signal HSEL2 supplied from the second circuit 60. The output signals of the three output-side selection switching elements 725a, 725b, 725c are output to the three connecting terminals 740.

Figure 11:
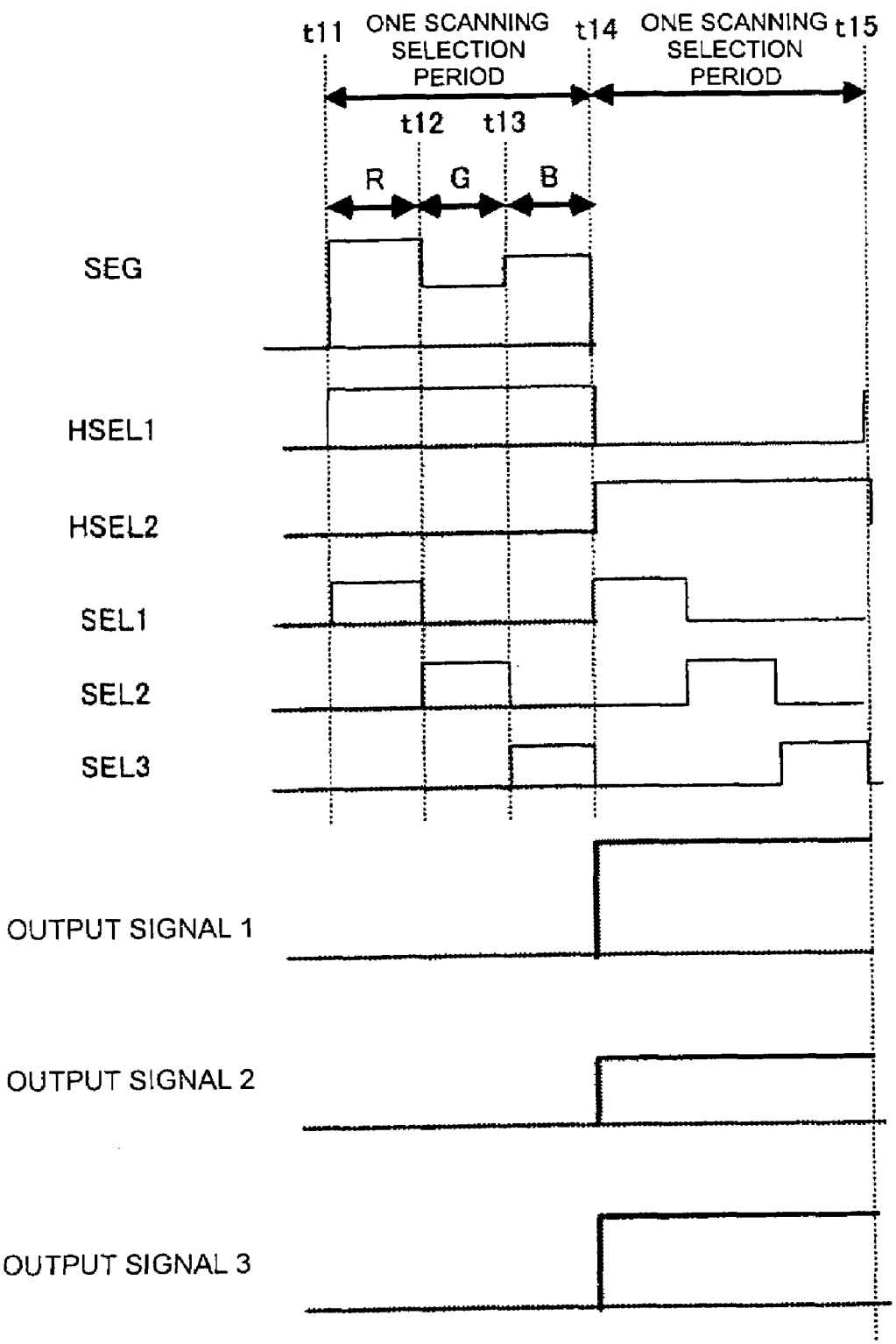
FIG. 11 is a timing chart showing operations of the selector circuit and a hold circuit according to the second embodiment.

FIG. 11 shows a timing chart explaining the operation of the selector circuit 702a and the hold circuit 760 shown in FIG. 10.

In FIG. 11, one scanning selection period starts at a time t1, the selection signal HSEL1 is output from the selection signal generating circuit 62, and the hold-side selection signal HSEL1 is at a high level. In the selector circuit 702a, the hold-side selection signal HSEL1 is supplied to the three hold-side selection switching elements 723a, 723b, 723c. The selection switching elements 723a, 723b, 723c select the one of the two storage capacitors 724 in response to the hold-side selection signal HSEL1.

When R period starts at the time t11, a first image signal is output from the R switching element 722a, when G period starts at a time t12, a second image signal is output from the G switching element 722b, and when B period starts at the time t13, a third image signal is output from the B switching element 722c.

The first to third image signals are input to the storage capacitors 724 selected by the hold-side selection switching elements 723a, 723b, 723c, to be stored, that is, be held in the storage capacitors 724.

In FIG. 11, during the time t11 to time t14, the output-side selection signal HSEL2 is at a low level, that is, the output-side selection signal HSEL2 is not supplied to the three output-side selection switching elements 725a, 725b, 725c in the hold circuit 760. In the state where the output-side selection signal HSEL2 is not supplied, different storage capacitors 724 from the storage capacitors 724 selected by the three hold-side selection switching elements 723a, 723b, 723c are selected by the three output-side selection switching elements 725a, 725b, 725c.

Subsequently, at the time t14, when next one scanning selection period starts, the hold-side selection signal HSEL1 is at a low level, and the output-side selection signal HSEL2 is at a high level. And then, the output-side selection signal HSEL2 is output from the selection signal generating circuit 62.

In the hold circuit 760, the output-side selection signal HSEL2 is supplied to the three output-side selection switching elements 725a, 725b, 725c, and the storage capacitors 724 in which the first to the third image signals are stored during the time t11 to the time t14 are selected by the three hold-side selection switching elements 723a, 723b, 723c . Therefore, the first to third image signals stored by the selected storage capacitors 724 are output from the output-side selection switching elements 725a, 725b, 725c.

Accordingly, at the time t14, the level of the output signal 1 is a level corresponding to the first image signal, the level of the output signal 2 is a level corresponding to the second image signal, and the level of the output signal 3 is a level corresponding to the third image signal.

During the time t14 to the time t15, the selector circuit 702a is in a state where the hold-side selection signal HSEL1 is not supplied to the three hold-side selection switching elements 723a, 723b, 723c. In this state, different storage capacitors 724 from the storage capacitors 724 selected by the three output-side selection switching elements 725a, 725b, 725c are selected by the three output-side selection switching elements 723a, 723b, 723c. Therefore, during the time t14 to the time t15, the first to third image signals are held in the storage capacitors 724.

In the second embodiment, the image signals can be output in the respective data lines 6a during one scanning selection period, and thus the line-sequential driving of the plurality of data lines 6a can be realized. As a result, since it is possible to write satisfactorily the image signals in the respective data lines 6a, the pixel switching TFT 30 in the respective pixels is preferably formed by using the amorphous silicon.

<3: Modification>

Figure 12:
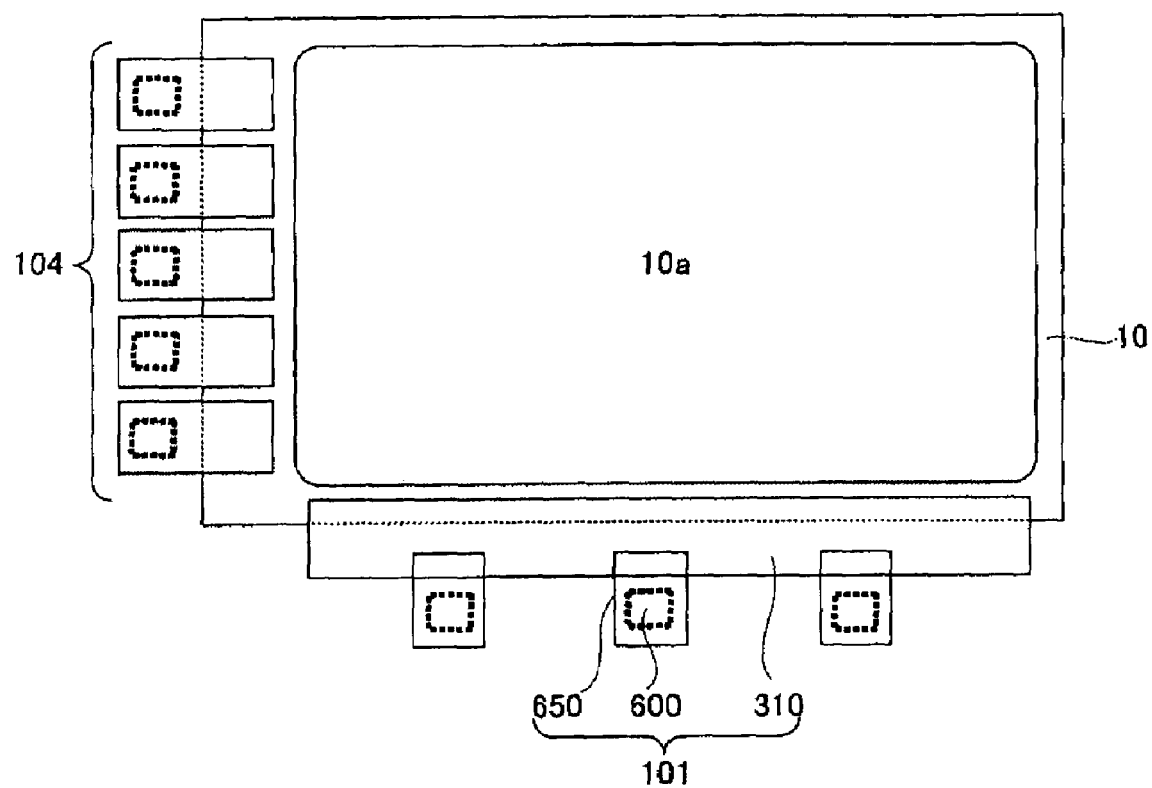
FIG. 12 is a plan view showing schematically a of an element substrate in a liquid crystal device according to the modification.

A modification of the first and second embodiment as mentioned above will be explained. FIG. 12 is a plan view showing schematically the of the element substrate 10 in a liquid crystal device according to this modification. In the data line driving circuit 101, chips 600 may be mounted on a plurality of wiring bases 650, and the plurality of wiring bases 650 may be mounted on the circuit substrate piece 310. As a result, it is possible to mount the chips 600 on the circuit substrate piece 310.

The wiring bases 650 are preferably formed by a flexible substrate or a rigid substrate. A plurality of wiring lines (not shown in FIG. 12) are formed in the wiring bases 650, in a state mounted on the circuit substrate piece 310, ends of the plurality of wiring lines are connected to the chips 600, and the other ends are connected to the third connecting terminals 740.

<4: Electronic Apparatus>

Next, examples in which liquid crystal devices are applied to various electronic apparatuses will be described.

<4-1: Projector>

First, a projector in which the liquid crystal device is used as a light valve will be described. In this case, it is possible to obtain intelligent and high performance projectors which utilize the technical property of the IC, the LSI, the low-temperature polysilicon technology, or the amorphous silicon technology.

Figure 13:
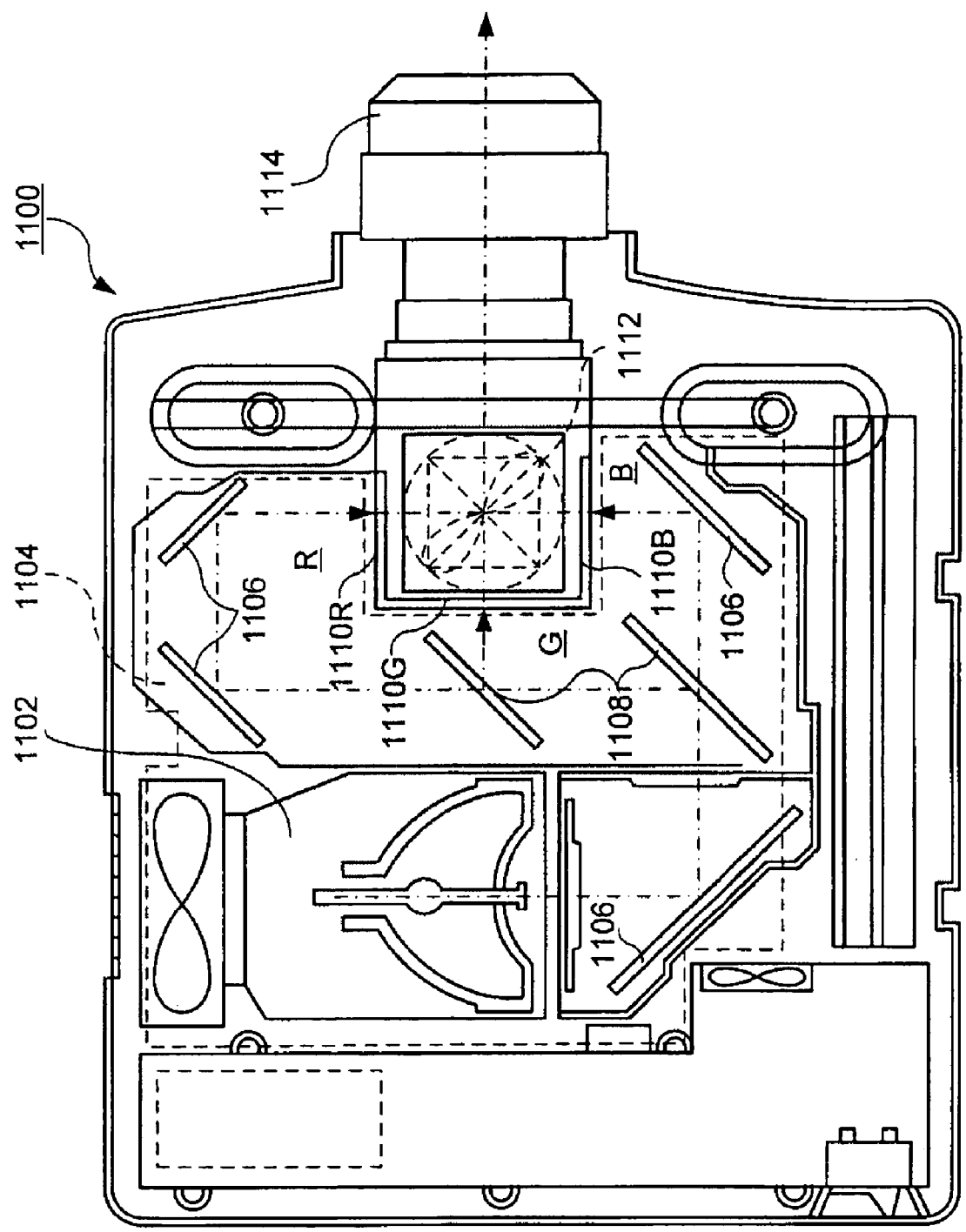
FIG. 13 is a plan view showing a of a projector as an example of an electronic apparatus equipped with the liquid crystal device.

FIG. 13 is a plan view showing an example of a configuration of a projector. As shown in FIG. 13, within the projector 1100, a lamp unit 1102 which comprises white light sources such as halogen lamps is provided. Light emitted from the lamp unit 1102 is divided into light components of three primary color of RGB by means of four mirrors 1106 arranged within a light guide 1104 and two dichroic mirrors 1108. The light components are respectively incident to liquid crystal panels 1110R, 1110B, and 1110G which serve as light valves corresponding to the respective primary colors.

The s of the liquid crystal devices 1110R, 1110B, and 1110G are the same as that of the above-mentioned liquid crystal device. The liquid crystal panels 1110R, 1110B, and 111G are driven by means of the respective primary color signals of R, G and B which are supplied from an image signal processing circuit. And then, light components modulated by the liquid crystal panels are incident to a dichroic prism 1112 in three directions. In the dichroic prism 1112, the R and B light components are refracted by 90 degrees, and the G light component goes straight ahead. Therefore, images of the respective colors are synthesized, such that a color image is projected on a screen via a projective lens 1114.

Here, referring to display images by means of the respective liquid crystal devices 1110R, 1110B, and 1110G, the display image of the liquid crystal device 1110G is needed to be inverted from side to side with respect to the display images by means of the liquid crystal devices 1110R and 1110B.

Moreover, since the light components corresponding to the respective primary colors of R, G and B are incident to the liquid crystal devices 1110R, 1110B, and 1110G by means of the dichroic mirror 1108, there is no need to provide a color filter.

<4-2: Mobile Computer>

Next, an example in which the liquid crystal device is applied to a mobile personal computer will be described.

In this case, it is possible to obtain intelligent and high performance projectors which utilize the technical property of the IC, the LSI, the low-temperature polysilicon technology, or the amorphous silicon technology.

Figure 14:
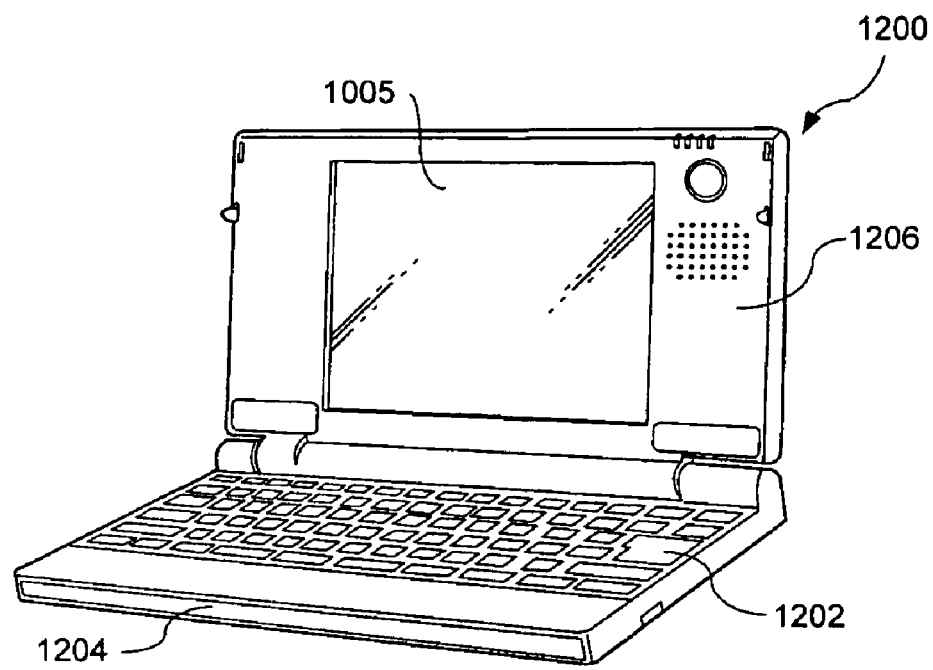
FIG. 14 is a perspective view showing a of a personal computer as another example of an electronic apparatus equipped with the liquid crystal device.

FIG. 14 is a perspective view showing a configuration of the personal computer. In FIG. 14, the computer 1200 comprises a main body 1204 having a keyboard 1202, and a liquid crystal display unit 1206. The liquid crystal display unit 1206 is made by adding a backlight to the rear surface of the above-mentioned liquid crystal device 1005.

<4-3: Cellular Phone>

In addition, an example in which a liquid crystal device is applied to a cellular phone will be described. In this case, it is possible to obtain intelligent and high performance projectors which utilize the technical property of the IC, the LSI, the low-temperature polysilicon technology, or the amorphous silicon technology.

Figure 15:
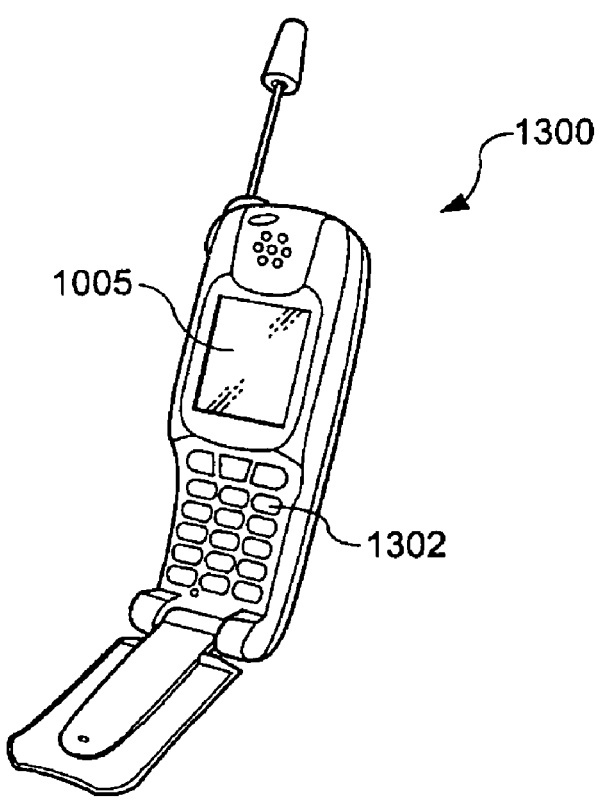
FIG. 15 is a perspective view showing a of a mobile phone as an example of an electronic apparatus equipped with the liquid crystal device.

FIG. 15 is a perspective view showing a configuration of the cellular phone. In FIG. 15, the cellular phone 1300 has a plurality of operating buttons 1302 and a reflective liquid crystal panel 1005. With respect to the reflective liquid crystal panel 1005, if necessary, a front light is provided in a front surface thereof.

Moreover, in addition to the electronic apparatuses described with reference to FIGS. 13 to 15, a liquid crystal television, a view finder type or monitor-direct-view type video tape recorder, a car navigation device, a pager, an electronic organizer, an electronic calculator, a word processor, a workstation, a videophone, a POS terminal, a device having a touch panel or the like may be exemplified. And then, it is needless to say that the present invention can be applied to these electronic apparatuses.

The present invention is not limited to the above-mentioned embodiments, but various modifications can be made within a scope without departing from a spirit or an idea of the present invention read on the claims and the specification. An electro-optical device and an electronic apparatus having the electro-optical device are also included in a technical scope of the present invention.

What is claimed is:

1. An electro-optical device comprising:
   an element substrate having a plurality of pixels and a plurality of data lines electrically connected to the plurality of pixels;
   a circuit substrate piece mounted on the element substrate and having a first circuit which is connected to the plurality of data lines and has a plurality of thin film transistors; and
   an integrated circuit mounted on the circuit substrate piece and having a second circuit, which is connected to the first circuit, for driving the plurality of pixels via the first circuit and the plurality of data lines.

2. The electro-optical device according to claim 1, wherein the plurality of thin film transistors are formed by low-temperature polysilicon.

3. The electro-optical device according to claim 1, further comprising a data line driving circuit having the first circuit and the integrated circuit.

4. The electro-optical device according to claim 1, wherein the first circuit has a selector circuit formed by some of the plurality of thin film transistors, and output ends of the some of the plurality of thin film transistors are connected to the plurality of data lines.

5. The electro-optical device according to claim 1, wherein the first circuit further has a precharge circuit for precharging each of the data lines at a predetermined potential.

6. The electro-optical device according to claim 1, wherein the first circuit further has an electrostatic protective circuit.

7. The electro-optical device according to claim 1, wherein the integrated circuit is COG-mounted on the circuit substrate piece.

8. The electro-optical device according to claim 1, wherein the integrated circuit is connected to the circuit substrate piece after being mounted on a wiring substrate having an FPC.

9. The electro-optical device according to claim 1, wherein the pixels have pixel-switching thin film transistors formed by using amorphous silicon or low-temperature polysilicon.

10. The electro-optical device according to claim 1, wherein the first circuit is connected to the plurality of data lines by a conductive adhesive having conductive beads.

11. An electro-optical apparatus comprising an electro-optical device according to claim 1.

* * * * *